United States Patent
Liao et al.

(10) Patent No.: US 12,261,188 B2
(45) Date of Patent: Mar. 25, 2025

(54) IMAGE SENSOR DEVICE AND METHODS OF FORMING THE SAME

(71) Applicant: Taiwan Semiconductor Manufacturing Company, Ltd., Hsinchu (TW)

(72) Inventors: Keng-Ying Liao, Hsinchu (TW); Yu-Chu Lin, Hsinchu (TW); Chih Wei Sung, Hsinchu (TW); Shih Sian Wang, Hsinchu (TW); Chi-Chung Jen, Hsinchu (TW); Yu-chien Ku, Hsinchu (TW); Yen-Jou Wu, Hsinchu (TW); Huai-jen Tung, Hsinchu (TW); Po-Zen Chen, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 111 days.

(21) Appl. No.: 18/301,714

(22) Filed: Apr. 17, 2023

(65) Prior Publication Data
US 2023/0253433 A1    Aug. 10, 2023

Related U.S. Application Data

(62) Division of application No. 16/851,643, filed on Apr. 17, 2020, now Pat. No. 11,652,127.

(51) Int. Cl.
H01L 27/146    (2006.01)

(52) U.S. Cl.
CPC .... H01L 27/14636 (2013.01); H01L 27/1464 (2013.01); H01L 27/14683 (2013.01)

(58) Field of Classification Search
CPC ........... H01L 27/14636; H01L 27/1464; H01L 27/14683
See application file for complete search history.

(56) References Cited

U.S. PATENT DOCUMENTS

| | | |
|---|---|---|
| 7,939,362 B2 | 5/2011 | Lee |
| 8,222,708 B2 | 7/2012 | Lee |

(Continued)

FOREIGN PATENT DOCUMENTS

| | | |
|---|---|---|
| CN | 110310968 A | 10/2019 |
| CN | 111029349 A | 4/2020 |

(Continued)

OTHER PUBLICATIONS

Korean Notification of Reason for Refusal on KR Appl. Ser. No. 10-2020-0087606 dated Jan. 25, 2022 (17 pages).

(Continued)

*Primary Examiner* — Mounir S Amer
*Assistant Examiner* — Alexander Belousov
(74) *Attorney, Agent, or Firm* — FOLEY & LARDNER LLP

(57) ABSTRACT

A device is disclosed. The device includes a plurality of pixels disposed over a first surface of a semiconductor layer. The device includes a device layer disposed over the first surface. The device includes metallization layers disposed over the device layer. One of the metallization layers, closer to the first surface than any of other ones of the metallization layers, includes at least one conductive structure. The device includes an oxide layer disposed over a second surface of the semiconductor layer, the second surface being opposite to the first surface, the oxide layer also lining a recess that extends through the semiconductor layer. The device includes a spacer layer disposed between inner sidewalls of the recess and the oxide layer. The device includes a pad structure extending through the oxide layer and the device layer to be in physical contact with the at least one conductive structure.

20 Claims, 15 Drawing Sheets

(56) References Cited

U.S. PATENT DOCUMENTS

| | | |
|---|---|---|
| 8,426,938 B2 | 4/2013 | Park et al. |
| 8,736,009 B2 | 5/2014 | Park et al. |
| 8,947,566 B2 | 2/2015 | Kobayashi et al. |
| 9,209,220 B2 | 12/2015 | Kobayashi et al. |
| 9,508,775 B2 | 11/2016 | Kobayashi et al. |
| 9,960,200 B1 | 5/2018 | Li et al. |
| 10,038,025 B2 | 7/2018 | Huang et al. |
| 10,283,549 B2 | 5/2019 | Huang et al. |
| 10,535,698 B2 | 1/2020 | Cheng et al. |
| 10,566,374 B2 | 2/2020 | Huang et al. |
| 11,069,736 B2 | 7/2021 | Huang et al. |
| 11,177,309 B2 | 11/2021 | Cheng et al. |
| 2010/0167456 A1 | 7/2010 | Lee |
| 2010/0207226 A1 | 8/2010 | Park et al. |
| 2011/0198717 A1 | 8/2011 | Lee |
| 2013/0037958 A1 | 2/2013 | Ho et al. |
| 2013/0105924 A1 | 5/2013 | Kobayashi et al. |
| 2013/0105925 A1 | 5/2013 | Gallagher et al. |
| 2013/0203209 A1 | 8/2013 | Park et al. |
| 2015/0118782 A1 | 4/2015 | Kobayashi et al. |
| 2016/0056189 A1* | 2/2016 | Kobayashi ........ H01L 27/14687 438/59 |
| 2016/0300871 A1 | 10/2016 | Borthakur et al. |
| 2017/0117316 A1 | 4/2017 | Hsu et al. |
| 2017/0186802 A1* | 6/2017 | Huang .............. H01L 27/14689 |
| 2017/0186849 A1 | 6/2017 | Chen et al. |
| 2017/0256568 A1 | 9/2017 | Shen et al. |
| 2017/0301715 A1 | 10/2017 | Cheng et al. |
| 2018/0350865 A1 | 12/2018 | Huang et al. |
| 2019/0057998 A1 | 2/2019 | Huang et al. |
| 2019/0165029 A1 | 5/2019 | Cheng et al. |
| 2020/0135794 A1 | 4/2020 | Huang et al. |
| 2020/0152687 A1 | 5/2020 | Cheng et al. |
| 2021/0327945 A1 | 10/2021 | Liao et al. |

FOREIGN PATENT DOCUMENTS

| | | |
|---|---|---|
| JP | 2012-033878 A | 2/2012 |
| JP | 2017-120912 A | 7/2017 |
| KR | 100649034 B1 | 11/2006 |
| KR | 20100076520 A | 7/2010 |
| KR | 20100093367 A | 8/2010 |
| KR | 20190062128 A | 6/2019 |
| TW | 201725715 A | 7/2017 |
| TW | 201729408 A | 8/2017 |
| TW | 201807759 A | 3/2018 |
| TW | 201828461 A | 8/2018 |
| TW | 202015230 A | 4/2020 |
| WO | WO-2012/001915 A1 | 1/2012 |

OTHER PUBLICATIONS

Korean Request for the Submission of an Opinion on KR Appl. Ser. No. 10-2020-0087606 dated Jul. 11, 2022 (17 pages).

Non-Final Office Action on U.S. Appl. No. 16/851,643 DTD Jun. 17, 2022.

Notice of Allowance on U.S. Appl. No. 16/851,643 DTD Jan. 5, 2023.

Restriction Requirement on U.S. Appl. No. 16/851,643 dated Jan. 27, 2022 (6 pages).

Taiwan First Office Action on TW Patent Appl. No. 110100830 dated Aug. 10, 2021 (8 pages).

Office Action issued in connection with Chinese Appl. No. 202110026097.3 dated Jan. 16, 2025.

* cited by examiner

IMAGE SENSOR DEVICE AND METHODS OF FORMING THE SAME

REFERENCE TO RELATED APPLICATION

This application is a divisional application of U.S. application Ser. No. 16/851,643, filed Apr. 17, 2020, which is incorporated by reference herein in its entirety.

BACKGROUND

The present disclosure generally relates to semiconductor devices, and particularly to image sensor devices and method of forming the same.

Semiconductor image sensors are used to sense incoming visible or non-visible radiation, such as visible light, infrared light, etc. Complementary metal-oxide-semiconductor (CMOS) image sensors (CIS) and charge-coupled device (CCD) sensors are used in various applications, such as digital still cameras, mobile phones, tablets, goggles, etc. These image sensors utilize an array of pixels that absorb (e.g., sense) the incoming radiation and convert it into electrical signals. A back side illuminated (BSI) images sensor device is one example of image sensor devices. These BSI image sensor devices are operable to detect light from its backside.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
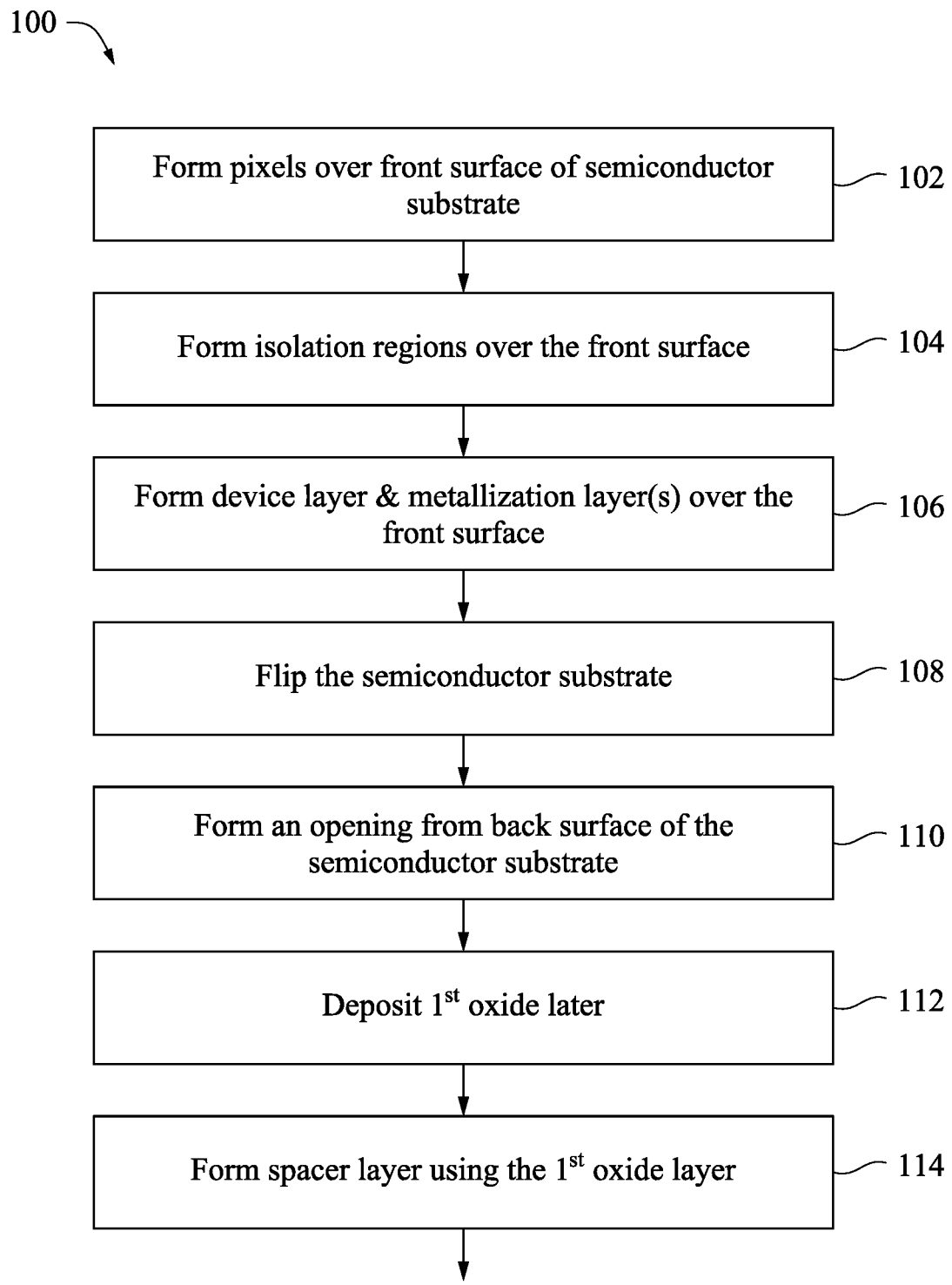
FIGS. 1A and 1B illustrate a flow chart of an example method for making an image sensor device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The terms "about" and "substantially" can indicate a value of a given quantity that varies within 5% of the value (e.g., ±1%, ±2%, ±3%, ±4%, ±5% of the value).

In general, a back side illuminated (BSI) image sensor device include a semiconductor substrate (e.g., silicon substrate) with pixels or radiation-sensing regions formed therein. As disclosed herein, the terms "radiation-sensing regions" and "pixels" may be used interchangeably. A BSI image sensor device can include a pixel array arranged within the semiconductor substrate. The pixel array is vertically arranged with respect to a multilevel metallization layer (e.g., one or more interconnect structures) formed on a first surface of the semiconductor substrate. The first surface of the semiconductor substrate is herein referred to as a "front side" or "front" surface of the semiconductor substrate. The pixel array extends into the semiconductor substrate and is configured to receive radiation (e.g., light) from or through a second surface of the semiconductor substrate opposite to the front surface of the semiconductor substrate. This second surface of the semiconductor substrate that receives the radiation (and is opposite to the front surface of the semiconductor substrate) is herein referred to as a "back side" or "back" surface of the semiconductor substrate.

The pixels in the semiconductor substrate are electrically isolated with isolation structures, such as deep trench isolation (DTI) structures. Aligned to the aforementioned isolation structures (and formed on the back surface of the semiconductor substrate) are respective grid structures that provide optical isolation between neighboring pixels. Adjacent grid structures collectively form cells. Further, the cells collectively form a composite grid structure configured to receive color filtering material. Based on the above description, the composite grid structure is formed on the back surface of the semiconductor substrate.

Color filtering material can be disposed between adjacent grid structures to form color filters. The color filtering material can be selected such that light with a desired wavelength passes through the filtering material, while light with other wavelengths is absorbed by the color filtering material. For example, a green light filtering material receiving unfiltered natural light would allow the green light portion (wavelengths between about 495 nm and about 570 nm) to pass through the filter, but would absorb all the other wavelengths. The color filters are aligned to respective pixels to provide filtered light to corresponding pixels.

The components of the BSI sensor device (e.g., pixels, transistors, capacitors, memory structures, other chips attached to the BSI sensor device, etc.) can be electrically coupled to external devices (e.g., an external circuitry) through wire connectors attached to pad structures formed on the back surface of the semiconductor substrate. To achieve this, the pad structures of a BSI sensor device physically extend from the back surface of the semiconductor substrate to the front surface of the semiconductor substrate and electrically connect to the multilevel metallization layer of the BSI sensor. Therefore, the multilevel metallization layer of the BSI sensor device, which provides electrical signal connection to the BSI sensor device, can be electrically coupled to an external device or circuit through the pad structures. The pad structures can be disposed at the periphery of the BSI sensor device around the pixels or the radiation-sensing regions.

In existing technologies of forming the pad structure in a BSI image sensor device, an opening (or a recess) extending at least from the back side to the front side of its semiconductor substrate is generally formed. The opening can be characterized with a depth up to several microns. Such a deep opening can frequently cause one or more voids to be formed in a dielectric layer above and/or beneath the pad structure. For example, the void may be formed at the corner of the opening, partially due to its deep depth. The void can disadvantageously facilitate penetration of acids or etchants through the dielectric layer to the pad structure or underlying interconnect structure(s), which can cause various interconnection issues (e.g., an increased contact resistance, an increased RC delay, an electromigration effect). Thus, the existing technologies of fabricating a BSI image sensor device are not entirely satisfactory.

The present disclosure provides various embodiments of a BSI image sensor device and methods of fabricating the same. The BSI image sensor device, as disclosed herein, includes a spacer layer formed at least around the corner of a recess where a pad structure is formed. In various embodiments, the spacer layer may have a tapered profile, for example, being characterized with a lower portion that is wider than an upper portion. By forming such a spacer layer around the corners of a relatively deep recess, a profile of the recess can be effectively "rounded off" or otherwise "elevated." As such, when depositing a dielectric layer over the recess, formation of the void, which is typically found in the image sensor devices made by existing technologies, can be avoided. Accordingly, the disclosed BSI image sensor device can be characterized with more reliable pad structures and interconnect structures, when compared to the existing BSI image sensor devices.

Figure 1B:
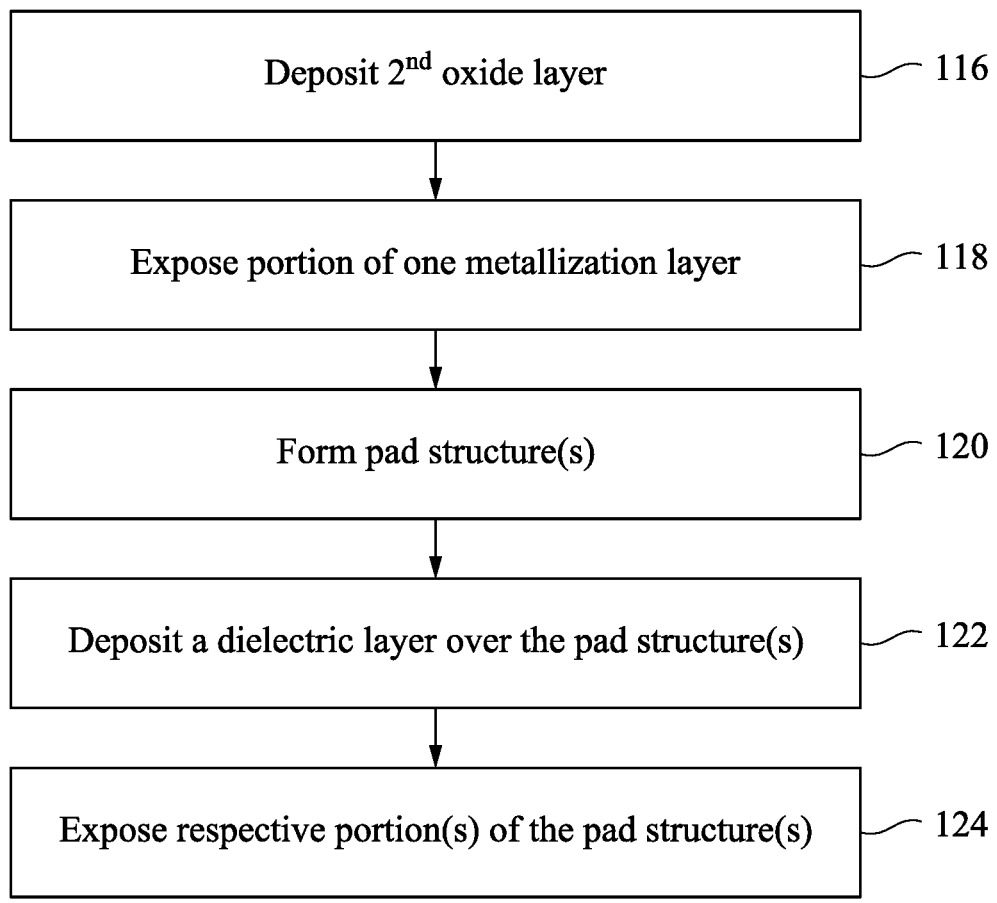

FIGS. 1A and 1B collectively illustrate a flowchart of a method 100 to form a BSI image sensor device, according to one or more embodiments of the present disclosure. It is noted that the method 100 is merely an example, and is not intended to limit the present disclosure. Accordingly, it is understood that additional operations may be provided before, during, and after the method 100 of FIGS. 1A-B, and that some other operations may only be briefly described herein. In some embodiments, operations of the method 100 may be associated with cross-sectional views of a BSI image sensor device at various fabrication stages as shown in FIGS. 2, 3, 4, 5, 6, 7, 8, 9, 10, 11, 12, 13, 14, and 15, respectively, which will be discussed in further detail below.

In brief overview, the method 100 starts with operation 102 of forming a number of pixels (or radiation sensing regions) over the front surface of a semiconductor substrate. The method 100 continues to operation 104 of forming one or more isolation regions over the front surface. The method 100 continues to operation 106 of forming a device layer and one or more metallization layers over the front surface. The method 100 continues to operation 108 of flipping the semiconductor substrate. The method 100 continues to operation 110 of forming an opening from a back surface of the semiconductor substrate. The method 100 continues to operation 112 of depositing a first oxide layer. The method 100 continues to operation 114 of forming a spacer layer using the first oxide layer. The method 100 continues to operation 116 of depositing a second oxide layer. The method 100 continues to operation 118 of exposing a portion of one of the metallization layers. The method 100 continues to operation 120 of forming one or more pad structures. The method 100 continues to operation 122 of depositing a dielectric layer over the one or more pad structures. The method 100 continues to operation 124 of exposing respective portions of the one or more pad structures.

As mentioned above, FIGS. 2-15 each illustrate, in a cross-sectional view, a portion of a BSI image sensor device 200 at various fabrication stages of the method 100 of FIG. 1. FIGS. 2-15 are simplified for a better understanding of the concepts of the present disclosure. Although the figures illustrate the BSI image sensor device 200, it is understood that the BSI image sensor device 200 may include a number of other devices such as inductors, fuses, capacitors, coils, etc., which are not shown in FIGS. 2-15, for purposes of clarity of illustration.

Figure 2:
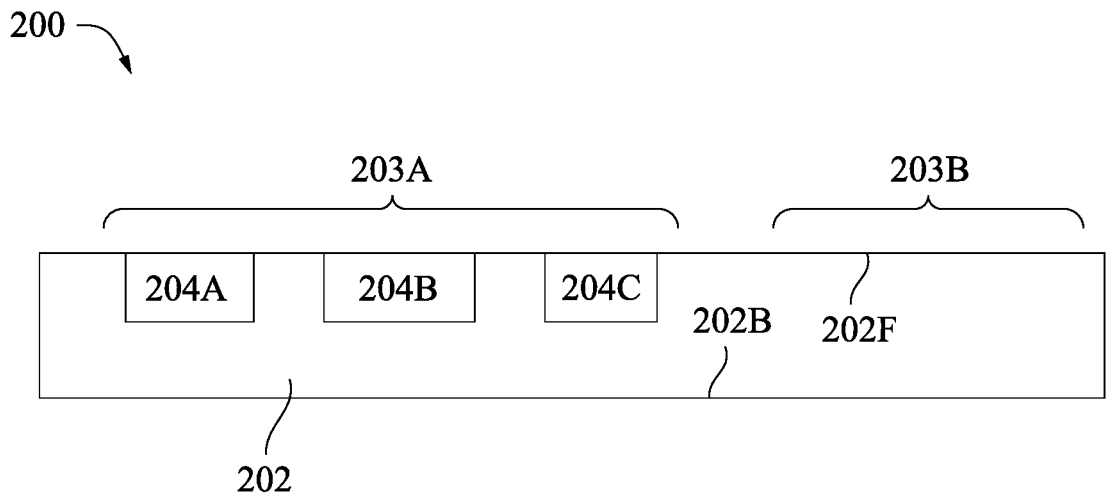
FIGS. 2, 3, 4, 5, 6, 7, 8, 9, 10, 11, 12, 13, 14, and 15 illustrate cross-sectional views of an example image sensor device during various fabrication stages, made by the method of FIGS. 1A-B, in accordance with some embodiments.
Figure 2:
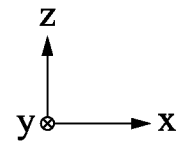

Corresponding to operation 102 of FIG. 1A, FIG. 2 is a cross-sectional view of the BSI image sensor device 200 including a number of pixels, 204A, 204B, and 204C, formed over a front surface 202F of a semiconductor substrate (or semiconductor layer) 202 at one of the various stages of fabrication. Opposite to the front surface 202F (e.g., along the Z axis), the semiconductor substrate 202 has a back surface 202B, through which the BSI image sensor device 200 is configured to receive incident radiation.

The semiconductor substrate 202 can include a bulk semiconductor wafer or a top layer of a semiconductor on insulator wafer (SOI), with a thickness greater than about 6 μm (e.g., about 6.15 μm, about 6.30 μm, about 6.50 μm, or about 6.70 μm). For example, the semiconductor substrate 202 can include a semiconductor material such as silicon, germanium, a compound semiconductor, an alloy semiconductor, any other suitable semiconductor material, and/or combinations thereof. Further, the semiconductor substrate 202 can be an epitaxial material strained for performance enhancement and/or a doped with n-type dopants, p-type dopants, or combinations thereof. In various embodiments, the semiconductor substrate 202 can include combinations of p-type and n-type doped regions.

Figure 3:
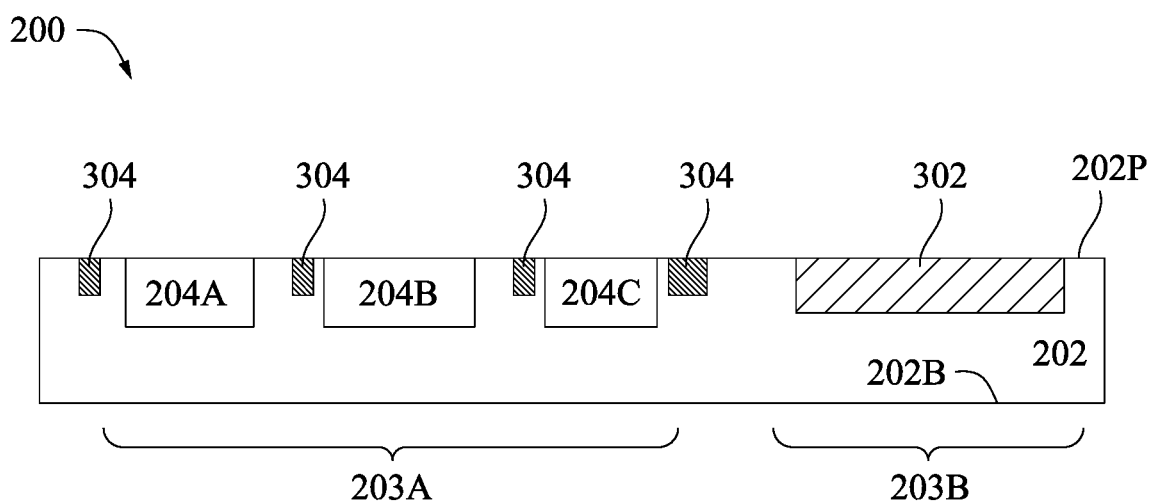
Figure 3:
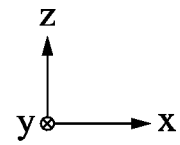

The pixels 204A-C are formed in a portion of the semiconductor substrate 202, which is herein referred to as a pixel region 203A. Although three pixels 204A-C are shown in FIG. 3 and the following cross-sectional figures, it should be understood that the BSI image sensor device 200 can include any desired number of pixels while remaining within the scope of the present disclosure. In some embodiments, the pixel region 203A is a center region of the semiconductor substrate 202. For example, the pixel region 203A may correspond to a region where a pixel array is formed in the BSI image sensor device 200, as shown in the top view of FIG. 16.

The pixels 203A-C are each configured to sense electromagnetic radiation, such as near infrared light. By way of example and not limitation, each of the pixels 203A-C includes a photodiode structure, such as a pinned layer photodiode, a photogate, a reset transistor, a source follower transistor, a transfer transistor, any other suitable structure, and/or combinations thereof. Further, the pixels 203A-C may sometimes be referred to as "radiation-detection devices" or "light-sensors." In some embodiments, the pixels 203A-C are formed by doping the semiconductor substrate 202 from the front surface 202F. For example, the doping process can include doping the semiconductor substrate 202 with a p-type dopant, such as boron, or an n-type dopant, such as phosphorous or arsenic. In some embodiments, the pixels 203A-C are formed by a dopant diffusion process and/or an ion implantation process.

In some embodiments, the semiconductor substrate 202 includes a pad region 203B adjacent to the pixel region 203A. One or more pad structures can be formed in the pad region 203B. Such pad structures can be located at the periphery of semiconductor substrate 202 to surround the pixel region 203A. For example, the pad region 203B corresponds to a region where one or more pad arrays are formed in the BSI image sensor device 200, as shown in the top view of FIG. 16.

Corresponding to operation 104 of FIG. 1A, FIG. 3 is a cross-sectional view of the BSI image sensor device 200 including one or more isolation regions, 302 and 304, formed over the front surface 202F at one of the various stages of fabrication. In some embodiments, the isolation region 302, formed in the pad region 203B of semiconductor substrate 202, can facilitate formation of the one or more pad structures. In some embodiments, prior to, concurrently with, or subsequently to forming the isolation region 302 in the pad region 203B, one or more isolation regions 304 can be formed in the pixel region 203A. Such isolation regions 304 can isolate pixels 204A-C from each other. By way of example and not limitation, the isolation regions 302 and 304 can be formed over respective portions of the front surface 202F.

In some embodiments, the isolation regions 302 and 304 can be formed by performing at least some of the following processes: forming a patternable layer (e.g., a photoresist (PR) layer) with a pattern that defines respective locations of the isolation regions 302 and 304 in the semiconductor substrate 202; etching (e.g., dry etching) the semiconductor substrate 202 using the patternable layer as an etch mask to form recesses; removing (e.g., wet etching) the patternable layer; depositing one or more layers including, but not limited to, silicon oxide, USG, PSG, BPSG, PEOX, FSG, a low-k dielectric material (e.g., with a k value less than about 3.9), or combinations as a blanket layer to fill the recesses; and planarizing (e.g., a chemical-mechanical polishing (CMP) process) the blanket layer.

Figure 4:
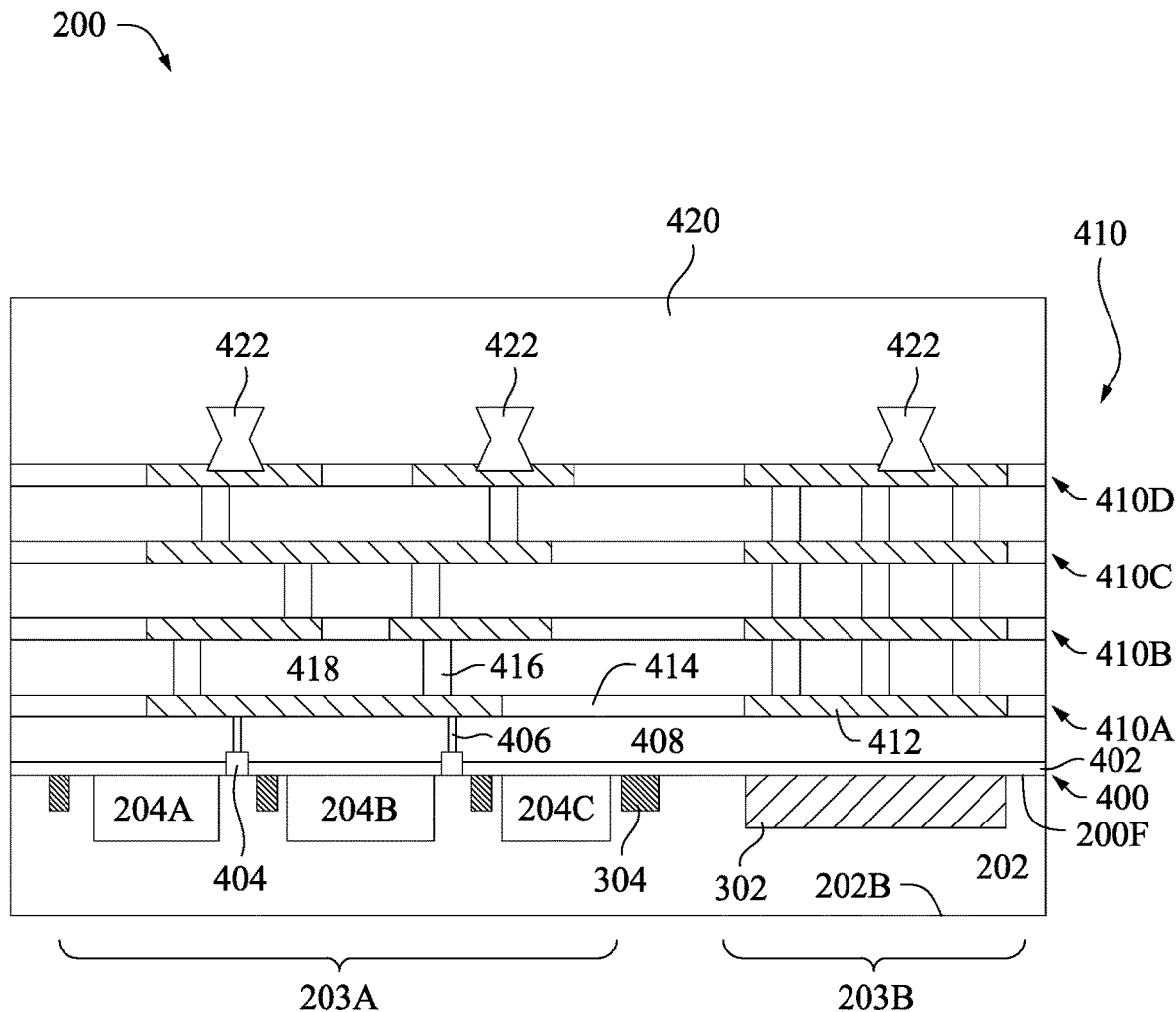

Corresponding to operation 106 of FIG. 1A, FIG. 4 is a cross-sectional view of the semiconductor device 200 including a device layer 400 and one or more metallization layers 410 at one of the various stages of fabrication. The device layer 400 and metallization layers 410 can be sequentially formed on or above the front surface 202F of the semiconductor substrate 202, in accordance with some embodiments. For example, the device layer 400 may be in contact with a certain portion of the front surface 202F.

The device layer 400 can include one or more semiconductor devices 404 (e.g., field effect transistors) formed according to a chip layout on front surface 202F of the semiconductor substrate 202. The device layer 400 may also include additional elements or structures, such as doped regions, dummy regions, epitaxial layers, capacitor structures, resistors, etc. These additional elements or structures of the device layer 400 are not shown in FIG. 4 for simplicity. In some embodiments, the BSI image sensor device 200 includes vertical conductive structures 406 (e.g., vias) that electrically connect the semiconductor devices 404 and other elements of the device layer 400 to upper metallization layers. The conductive structures 406 can form a portion of a middle of the line (MOL) wiring network. In some embodiments, the device layer 400 further includes a nitride layer 402 that is used as an etch stop layer (ESL) in a subsequent etching operation during the formation of the pad structures. In some embodiments, the ESL 402 is formed around the semiconductor devices 404, but not between the semiconductor devices 404 and the semiconductor substrate 202. The ESL 402, semiconductor devices 404, and conductive structures 406 may be embedded or overlaid by a corresponding dielectric layer 408.

The metallization layers 410 can include one or more metallization layers, such as metallization layers 410A, 410B, 410C, and 410D, as shown in FIG. 4. It should be understood that the image sensor device 200 can include any desired number of metallization layers while remaining within the scope of the present disclosure. In some embodiments, along the Z axis, the metallization layer 410A is a first, or bottommost, metallization layer (sometimes referred to as "M1" layer) and the metallization layer 410D is a topmost metallization layer (sometimes referred to as "top metal (TM)" layer). The metallization layers 410 can form a portion of a back end of the line (BEOL) wiring network. Each of the metallization layers 410 (e.g., 410A-D) can include one or more lateral conductive structures 412 (e.g., lines) embedded in a corresponding dielectric layer 414. In some embodiments, one or more conductive structures and a dielectric layer in which the conductive structure(s) are embedded may sometimes be collectively referred to as a metallization layer.

Across different metallization layers 410, one or more vertical conductive structures 416 (e.g., vias) can be extended through a corresponding dielectric layer 418 to electrically connect adjacent metallization layers along the Z axis. The lines 412 and vias 416, formed of copper, for example, may sometimes be referred to as copper interconnect structures. Although not shown, in some embodiments, each of the copper lines 412 and copper vias 416 may be surrounded by a (diffusion) barrier layer. The barrier layer can include a material selected from a group consisting of: tantalum (Ta), tantalum nitride (TaN), titanium nitride (TiN), titanium tungsten (TiW), and titanium (Ti). In some embodiments, such a barrier layer may sometimes be referred to as a part of the corresponding metallization layer (or the corresponding conductive structure).

The dielectric layers 408, 414, and 418 can electrically isolate the elements and/or structures therein. In some embodiments, each of the dielectric layers 408, 414, and 418 is a portion of an interlayer dielectric (ILD) or inter-metal dielectric (IMD) layer. For example, such an ILD or IMD layer includes silicon oxide, USG, BPSG, a low-k dielectric (e.g., with a dielectric constant lower than 3.9), or a stack of dielectrics—such as a low-k dielectric and another dielectric: (i) a low-k dielectric (e.g., carbon doped silicon oxide) and a silicon carbide with nitrogen doping; (ii) a low-k dielectric (e.g., carbon doped silicon oxide) and a silicon carbide with oxygen doping; (iii) a low-k dielectric (e.g., carbon doped silicon oxide) with silicon nitride; and/or (iv) a low-k dielectric (e.g., carbon doped silicon oxide) with silicon oxide.

In some other embodiments, the device layer 400 and/or the metallization layers 410 can be formed on a separate semiconductor substrate (e.g., different from the semiconductor substrate 202) and be subsequently attached to front surface 202F of the semiconductor substrate 202.

In certain applications of the image sensor device 200, an application specific integrated circuit (ASIC) and/or a silicon-on-chip (SoC) 420 can be attached to the top metallization layer 410D. Such a structure may sometimes be referred to as a three-dimensional (3D) stack, or 3D integrated circuit. In this regard, one or more bonding structures 422 can be used to electrically and mechanically bond the ASIC/SoC 420 to the top metallization layer 410D. The ASIC/SoC 420 can add functionality to the image sensor device 200 or may control functions of the image sensor device 200. In some embodiments, the ASIC/SoC 420 includes metallization layers, semiconductor devices, memory devices, or can be a stack of chips such as memory chips, central processing unit (CPU) chips, other functional chips (e.g., RF chips), or combinations thereof.

In accordance with some embodiments, fabrication of the BSI image sensor device 200 may continue with forming additional structures in or on the semiconductor substrate 202 from the back surface 202B. In this regard, such a partially-fabricated BSI image sensor 200 can be rotated 180° (flipped) around the X axis (as shown in FIG. 5), which also corresponds to operation 108 of FIG. 1A.

Upon flipping the semiconductor substrate 202, one or more isolation regions 504, aligned to the isolation regions 304, are formed to further isolate the pixels 204A-C in the pixel region 203A. The solation regions 504 may include one or more dielectric materials and, for example, form deep trench isolation (DTI) structures. The isolation regions 504 can be formed by etching semiconductor substrate 202 to form respective trenches between the pixels 204A-C. The trenches are subsequently filled with one or more dielectric materials. Although not shown in FIG. 5, subsequently to forming the isolation regions 504, one or more high-k (with a dielectric constant higher than 3.9) dielectric layers can optionally be formed over the isolation regions 504. For example, the high-k dielectric layers can each include a material selected from: $Ta_2O_5$, $HfO_2$, $Al_2O_3$, and combinations thereof. Such a high-k dielectric layer can be configured to dissipate the charges accumulated in the BSI image sensor device 200.

In some embodiments, the dielectric layers (e.g., including the dielectric layers forming the isolation regions 504 and the optional high-k dielectric layer(s)) can overlay both of the pixel region 203A and the pad region 204B of the semiconductor substrate 200. Prior to forming the isolation regions 504 on the back surface 202B, the semiconductor substrate 202 may be thinned to a desired thickness $T_1$. By way of example and not limitation, thickness $T_1$ can range from about 2 μm to about 6 μm, depending on the application of the BSI image sensor device 200. Thus, it shall be understood that the thickness, $T_1$, can range from and to any suitable values while remaining within the scope of the present disclosure. The thinning of semiconductor substrate 202 may be performed by a planarization process (e.g., a CMP process), an etch-back process (e.g., a dry etching process), some other thinning process (e.g., grinding), or a combination thereof. Thinning of semiconductor substrate 202 can facilitate formation of the isolation regions 504 and the subsequent formation of the pad structure(s).

Figure 5:
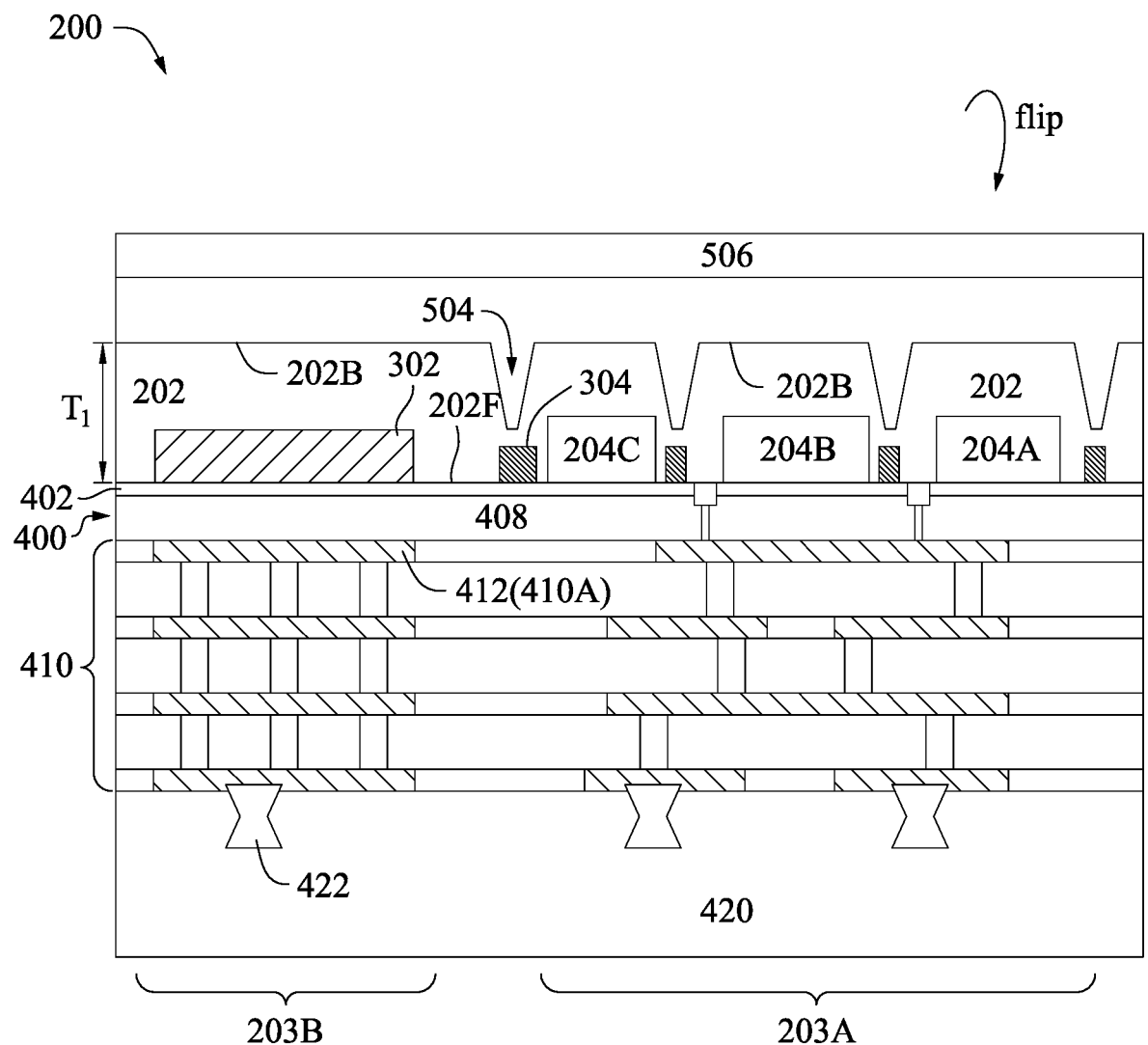

Subsequently to forming the isolation regions 504 (and the optional high-k dielectric layers) on the back surface 202B, a passivation layer 506 can be deposited over the back surface 202B, as shown in FIG. 5. The passivation layer 506 can be a dielectric layer such as, for example, silicon oxide, silicon nitride, or a combination thereof. In some embodiments, the passivation layer 506 is a protective layer or a hard mask (HM) layer grown or deposited on both of the pixel region 203A and the pad region 203B.

Figure 6:
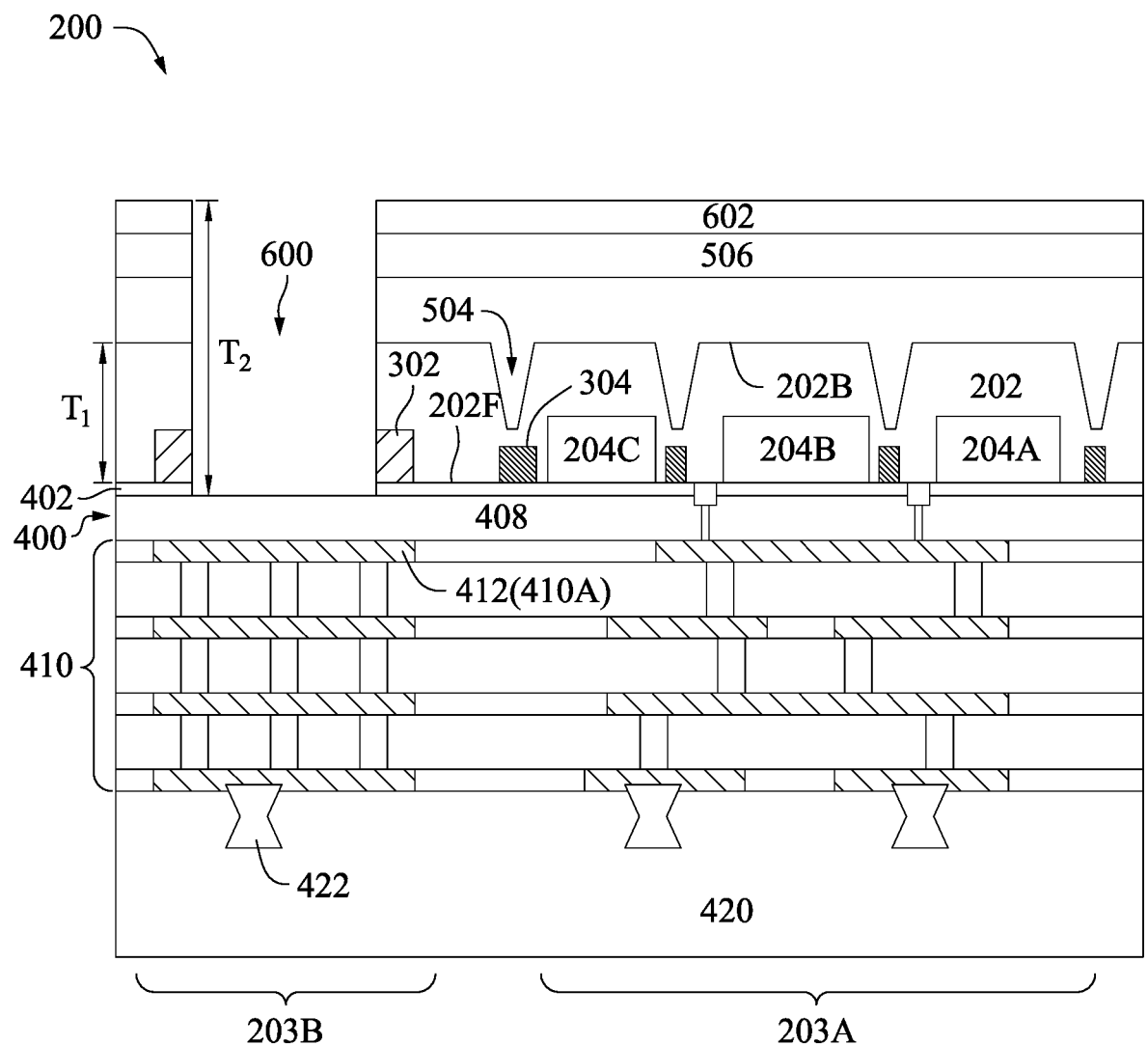

Corresponding to operation 110 of FIG. 1A, FIG. 6 is a cross-sectional view of the BSI image sensor device 200 including a recess (opening, or trench) 600 at one of the various stages of fabrication. The recess 600 is formed in the pad region 203B to expose a portion of the dielectric layer 408. As shown, the recess 600 may extend through at least the passivation layer 506, the dielectric layer(s) of the isolation regions 504, the semiconductor substrate 202, the isolation region 302, and the ESL 402. In the example where the thinned semiconductor substrate 202 has a thickness $T_1$ of about 6 μm, the recess 600 can be characterized with a depth, $T_2$, that is substantially greater than 6 μm. It shall be understood that the depth of the recess 600 can range from and to any suitable values, in accordance with the thickness of the thinned semiconductor substrate 202. Depending on the application for which the BSI image sensor device 200 is designed, the thickness of the thinned semiconductor substrate 202 (and the depth of the recess 600) may vary accordingly. For example, when the BSI image sensor device 200 is configured for absorbing visible light, the thickness of the thinned semiconductor substrate 202 (and the depth of the recess 600) may be selected to be at least 2 μm.

The recess 600 can be formed by performing at least some of the following processes: forming a patternable layer (e.g., a photoresist (PR) layer) 602 over the passivation layer 506; patterning the patternable layer 602 in the pad region 203A to expose a portion of the passivation layer 506 aligned with isolation region 302; etching (e.g., one or more dry etching processes) the passivation layer 506, the dielectric layer(s) of the isolation regions 504, the semiconductor substrate 202, the isolation region 302, and the ESL 402 to expose a portion of the dielectric layer 408; and removing the patternable layer 602.

Specifically, the dry etching processes may use one or more different etching gases. For example, the material of semiconductor substrate 202 (e.g., silicon) can be etched by a first dry etching process with a gas mixture of chlorine ($Cl_2$) and HBr, which endpoints on the isolation region 302. In some embodiments, such a first dry etching process etches between about 200 angstroms (Å) and 300 Å of material from the isolation region 302 before it is endpointed. It shall be understood that the first dry etching process can etch the isolation region 302 to any suitable depth, while remaining within the scope of the present disclosure. Subsequently, a second dry etching process, e.g., using tetrafluoromethane ($CF_4$) gas, removes the isolation region 302 and endpoints on the ESL 402. A third dry over-etch process, e.g., using octafluorocyclobutane ($C_4F_8$) gas, removes the ESL 402 to expose the dielectric layer 408 of the device layer 400, as shown in FIG. 6. In other words, the one or more etching processes may be terminated when at least a portion of the dielectric layer 408 of the device layer 400 in the pad region 203B is exposed through the recess 600.

Figure 7:
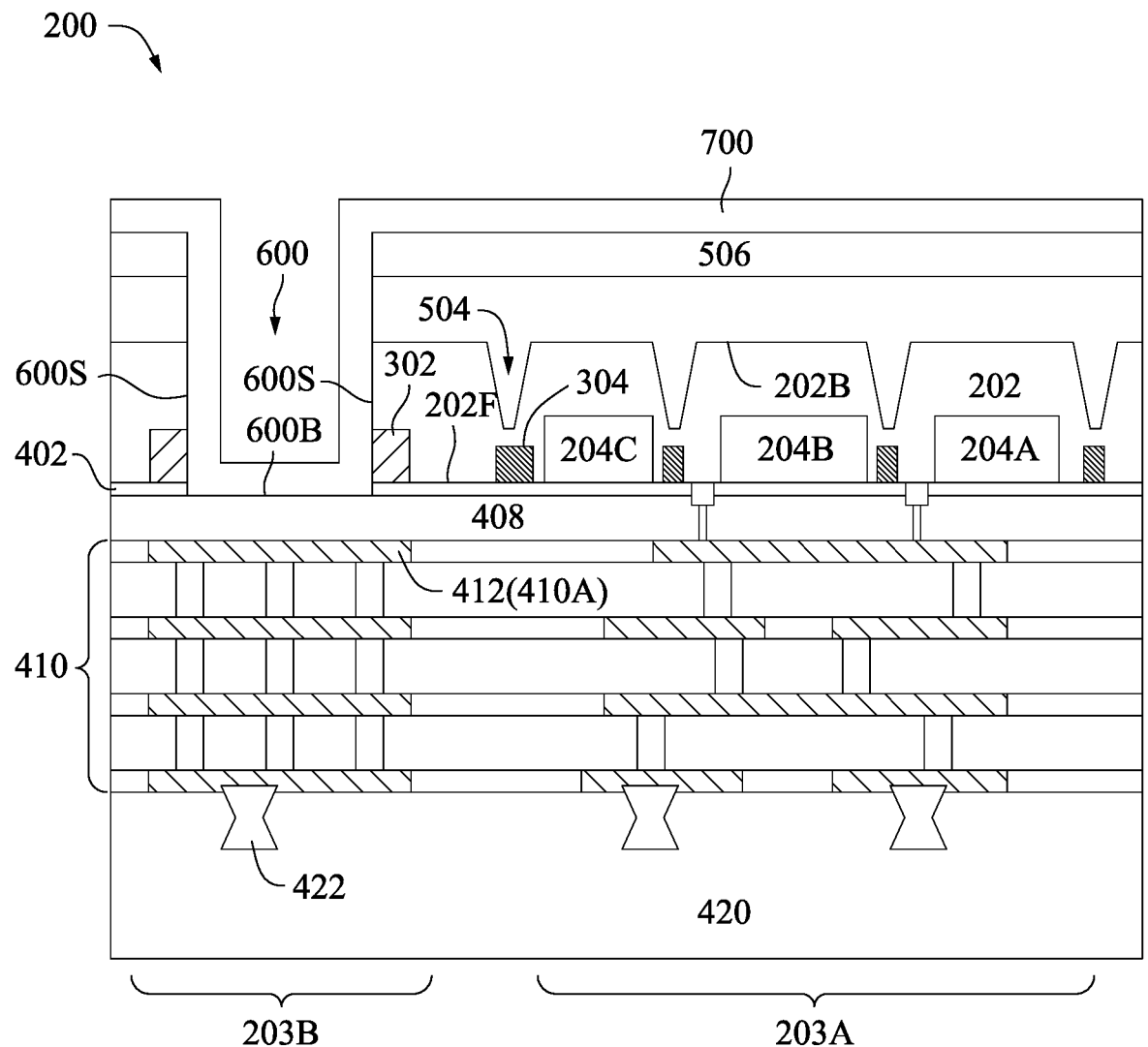

Corresponding to operation 112 of FIG. 1A, FIG. 7 is a cross-sectional view of the BSI image sensor device 200 including a first oxide layer 700 at one of the various stages of fabrication. After removing the patternable layer 602 (FIG. 6), the first oxide layer 700 can be conformally deposited to line the recess 600 (e.g., extending across a bottom surface 600B and inner sidewalls 600S of the recess 600) and overlay the exposed surface of the dielectric layer 408 and the passivation layer 506, as shown in FIG. 7. In some embodiments, the first oxide layer 700 is a silicon oxide dielectric, such as a PEOX, with a thickness range between about 100 nm and about 700 nm. It shall be understood that the thickness of the first oxide layer 700 can range from and to any suitable values while remaining within the scope of the present disclosure. In some other embodiments, the first oxide layer 700 includes a material selected from USG, PSG, BPSG, FSG, a low-k dielectric material, and combinations thereof.

Figure 8:
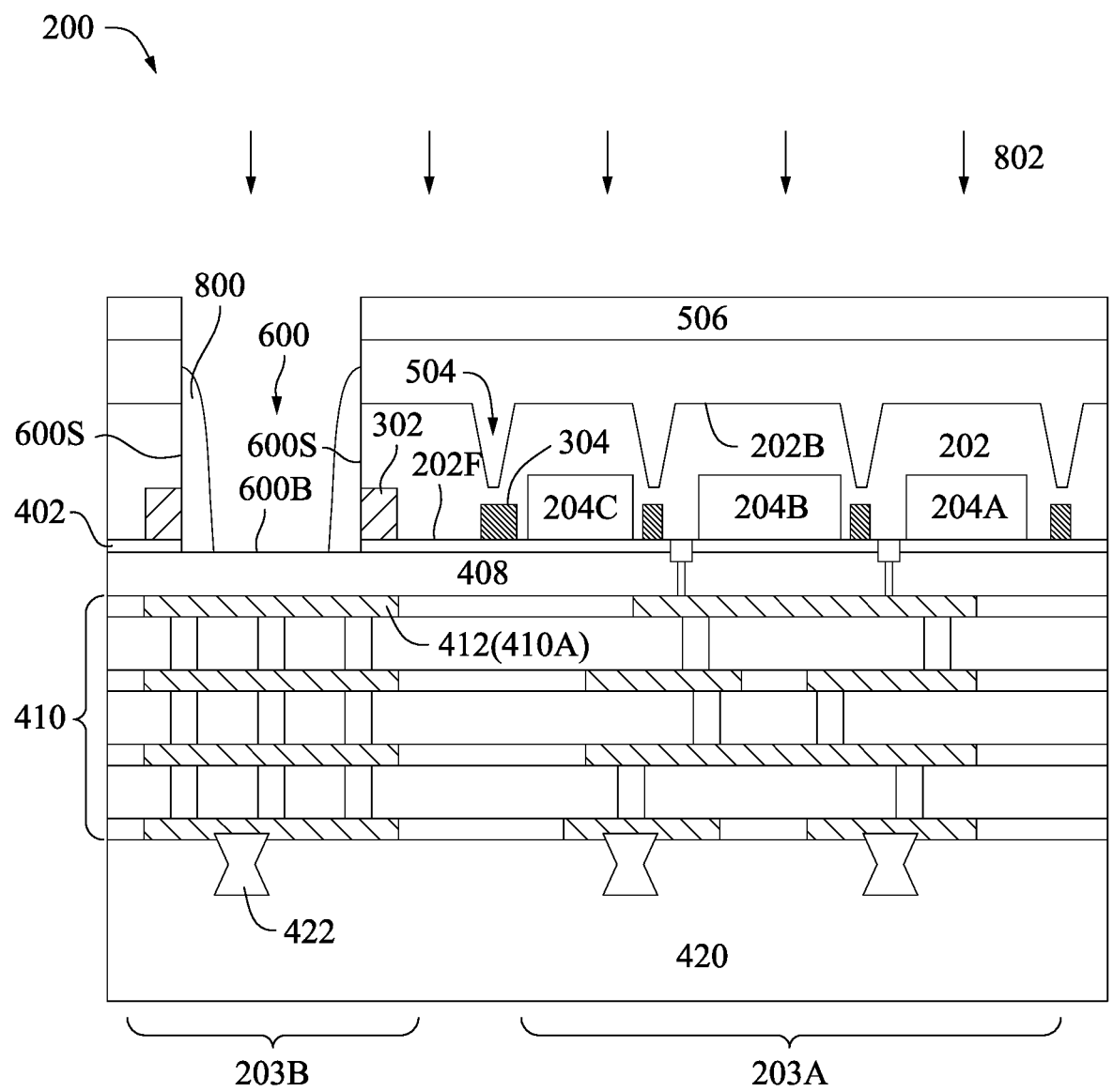

Corresponding to operation 114 of FIG. 1A, FIG. 8 is a cross-sectional view of the BSI image sensor device 200 including a spacer layer 800 at one of the various stages of fabrication. In some embodiments, the spacer layer 800 can be formed by performing at least one etching process 802 (illustrated by arrows in FIG. 8). The etching process 802 may be an anisotropic etching process (e.g., a reactive ion etching (RIE) process). As such, the etching process 802 can remove respective portions of the first oxide layer 700 overlaying the passivation layer 506 and a portion of the bottom surface 600B.

For example, the remaining first oxide layer 700 (i.e., the spacer layer 800) may be formed to extend along at least a portion of the inner sidewall 600S and overlay a portion of the bottom surface 600B. As shown, the portions of the inner sidewall 600S and bottom surface 600B are coupled to each other, such that corners of the recess 600 are overlaid by the spacer layer 800, while causing a portion of the bottom surface 600B to be exposed. Such an exposed portion of the bottom surface 600B (i.e., an exposed portion of the dielectric layer 408) can facilitate forming one or more pad structures thereupon, which shall be discussed below.

Each of the inner sidewalls 600S may be defined (e.g., constituted) by at least one of: a sidewall of the ESL 402, a sidewall of the semiconductor substrate 202 in the pad region 203B, a sidewall of the layer(s) forming the isolation region 504, or a sidewall of the passivation layer 506. For example, the illustrated embodiments of FIG. 8 (and the following cross-sectional figures) depicts that the portion of the inner sidewalls 600S along which the spacer layer 800 is extended includes the sidewall of the ESL 402, the sidewall of the semiconductor substrate 202, and a portion of the sidewall of the layer(s) forming the isolation region 504. It should be understood, however, that the spacer layer 800 can extend across any combinations of the sidewalls of the ESL 402, semiconductor substrate 202, the layer(s) forming the isolation region 504, the passivation layer 506, and the layer(s) between the isolation regions 504 and passivation layer 506, while remaining within the scope of the present disclosure.

In accordance with various embodiments, the spacer layer 800 can be characterized with a tapered profile. For example, the "tapered" spacer layer 800 can be formed to include a lower portion and an upper portion, where the lower portion is substantially wider (along the X axis) than the upper portion. A width of the spacer layer 800 may gradually increase from the upper portion toward the lower portion. In some embodiments, the spacer layer 800 may have a ratio of a lateral width of the lower portion to a width of the upper portion that is between about 2 and 5, although the ratio may be within other ranges while remaining within the scope of the present disclosure. By forming such a tapered spacer layer 800 in the recess 600, respective corners of the recess 600 may be filled up with at least the lower portions of the spacer layer 800, which can effectively round off the corners. As such, even though the recess 600 may present a profile with a relatively high aspect ratio, it may significantly prevent voids from being formed in the recess 600 when forming one or more layers over (e.g., to fill) the recess 600. As a non-limiting example, the sum of a lateral width of each of the lower portions of the spacer layer 800 may occupy an optimal ratio of a lateral width of the recess 600, e.g., from about 0.1 to about 0.7. When the ratio is too low, voids may still be formed within the subsequently formed layer(s). On the other hand where the ratio is too high, there may be not enough space for the subsequently formed pad structure(s) to land.

Figure 9:
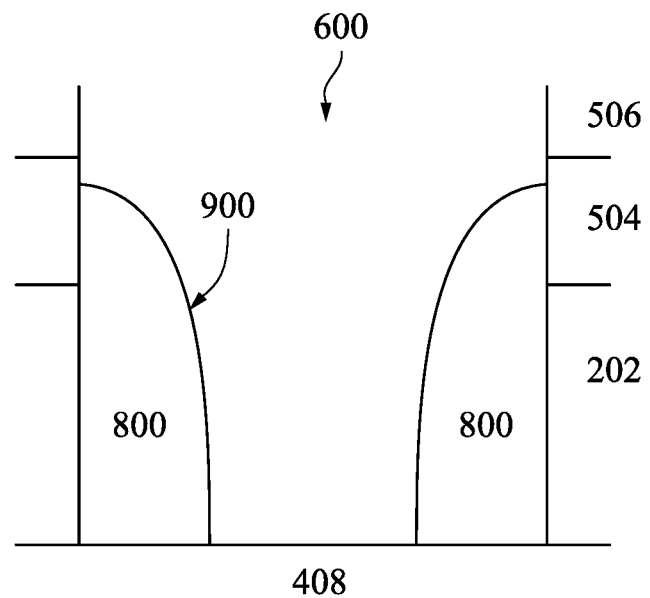
Figure 10:
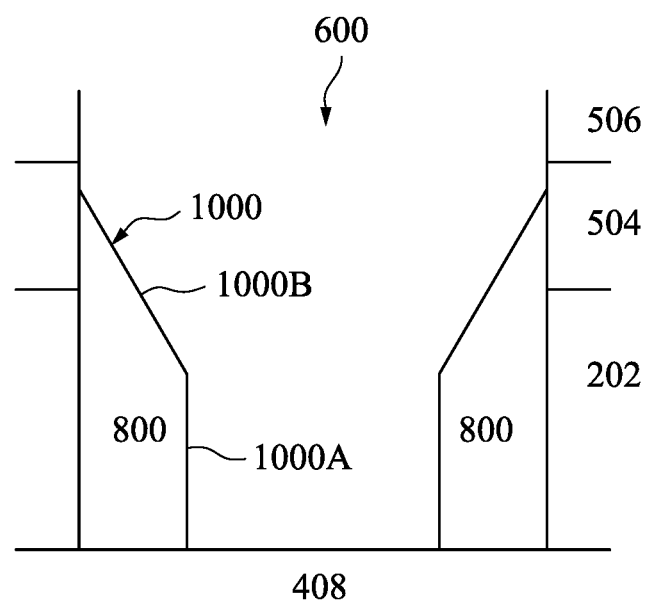

FIGS. 9 and 10, respectively, illustrate example profiles of the spacer layer 800, in accordance with various embodiments. Referring first to FIG. 9, the spacer layer 800 is characterized with an arc-based profile 900. For example, the profile 900 may present a circular upper surface continuous from the lower portion to the upper portion of the spacer layer 800. Referring then to FIG. 10, the spacer layer 800 is characterized with a facet-based profile 1000. For example, the profile 1000 may include one or more facets (edges or slopes) 1000A and 1000B, connected to one another, from the lower portion to the upper portion of the spacer layer 800.

Figure 11:
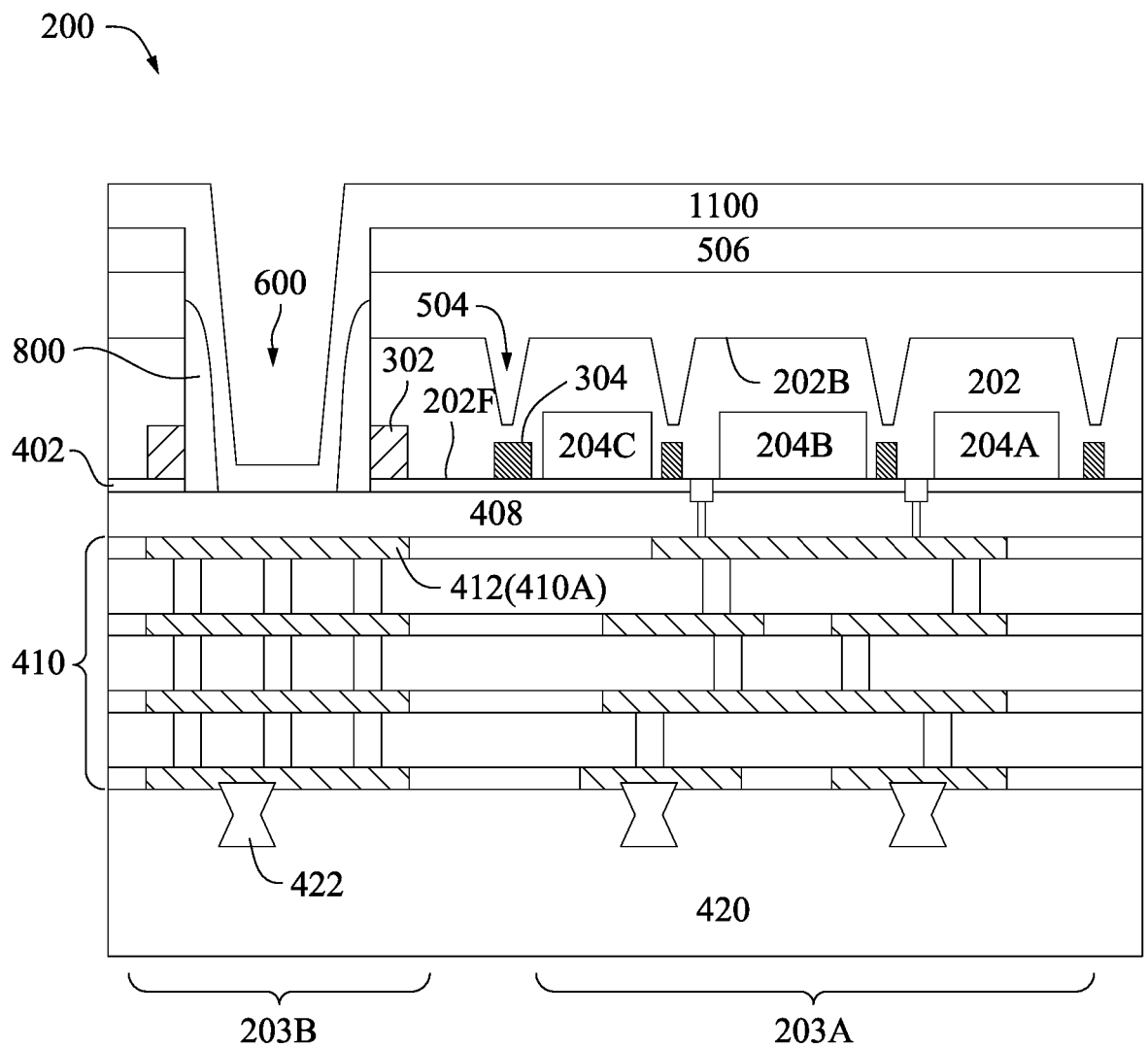

Corresponding to operation 116 of FIG. 1B, FIG. 11 is a cross-sectional view of the BSI image sensor device 200 including a second oxide layer 1100 at one of the various stages of fabrication. In some embodiments, the second oxide layer 1100 can be conformally deposited to line the recess 600 (e.g., at least overlaying the spacer layer 800) and overlay the exposed surface of the dielectric layer 408 and the passivation layer 506, as shown in FIG. 11. As such, the spacer layer 800 is disposed (e.g., sandwiched) between the inner sidewall 600S and the second oxide layer 1100. In some embodiments, the second oxide layer 1100 is a silicon oxide dielectric, such as a PEOX, with a thickness range between about 100 nm and about 700 nm. It shall be understood that the thickness of the second oxide layer 1100 can range from and to any suitable values while remaining within the scope of the present disclosure. In some other embodiments, the second oxide layer 1100 includes a material selected from USG, PSG, BPSG, FSG, a low-k dielectric material, and combinations thereof. The second oxide layer 1100 can include any other suitable dielectric material(s) while remaining within the scope of the present disclosure.

According to various embodiments, the first oxide layer 700 (the spacer layer 800) and the second oxide layer 1100 can include the same oxide material, but the first oxide layer 700 may be characterized with a greater resistivity against various etchants than the second oxide layer 1100. For example, the oxide material of the first oxide layer 700 may have a greater density than the oxide material of the second oxide layer 1100. In another example, the oxide material of the first oxide layer 700 may have a higher dielectric constant than the oxide material of the second oxide layer 1100.

Figure 12:
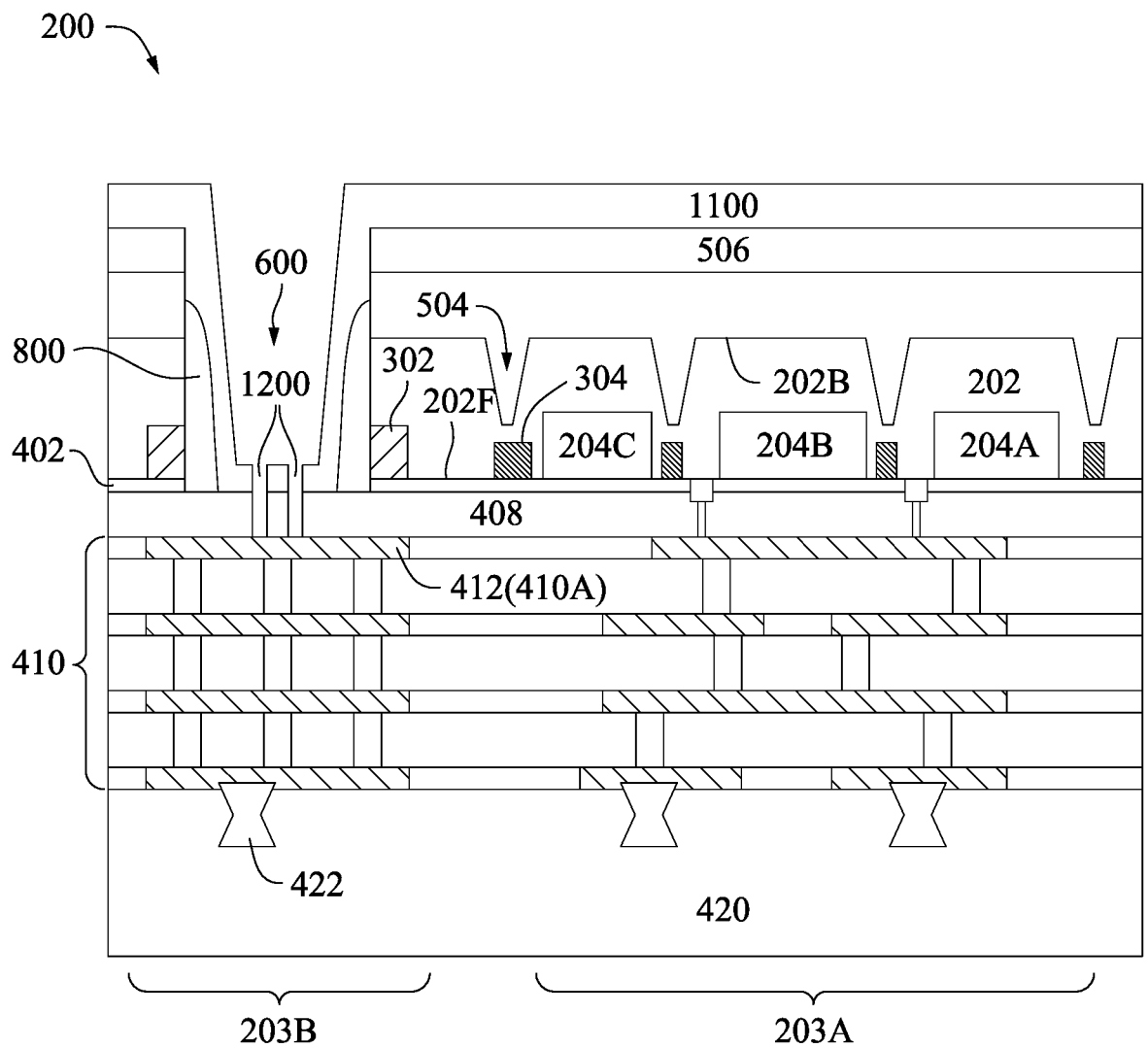

Corresponding to operation 118 of FIG. 1B, FIG. 12 is a cross-sectional view of the BSI image sensor device 200, in which one or more portions of the line 412 in the metallization layer 410A are exposed at one of the various stages of fabrication. In some embodiments, one or more dry etching processes may be performed, based on a pattern formed in the recess 600, on the second oxide layer 1100 and the dielectric layer 408 to expose the one or more portions of the line 412. As such, one or more openings 1200, following the pattern, can be formed. Upon openings 1200 being formed, the pattern (e.g., formed on a photoresist layer) can be removed. For example, a dry etching process, e.g., using tetrafluoromethane ($CF_4$) gas, removes, according to a photoresist layer having a pattern, one or more portions of the second oxide layer 1100 and one or more portions of the dielectric layer 408 and endpoints on the line 412 to form the openings 1200. Upon the openings 1200 being formed, the photoresist layer can be removed by acids or etchants. While etching the second oxide layer 1100 and the dielectric layer 408, the spacer layer 800 may remain covered (e.g., intact) by the second oxide layer 1100, in accordance with various embodiments.

Figure 13:
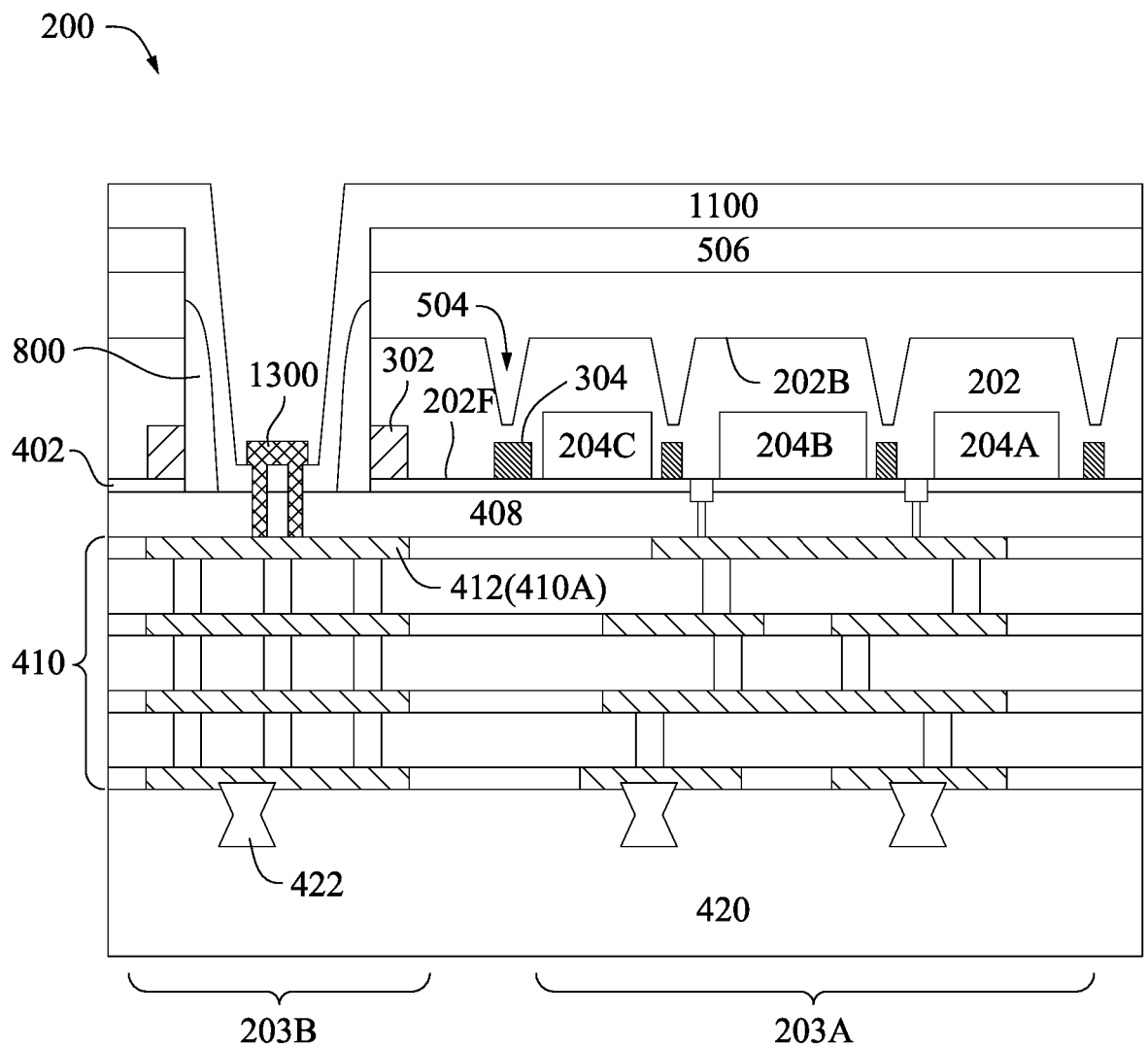

Corresponding to operation 120 of FIG. 1B, FIG. 13 is a cross-sectional view of the BSI image sensor device 200 including one or more pad structures 1300 at one of the various stages of fabrication. The pad structure 1300 is formed to be in physical contact with the line 412 in the metallization layer 410A. In some embodiments, a metal layer can be deposited to fill the openings 1200 and subsequently patterned in the recess 600 to form the pad structure 1300. For example, patterning of the metal layer can be accomplished with one or more lithography processes followed by one or more etching processes. In some embodiments, the pad structure 1300 includes a metal alloy such as, for example, aluminum-copper (AlCu). However, this is not limiting and other suitable metals or metal alloys may be used to form the pad structure 1300.

Figure 14:
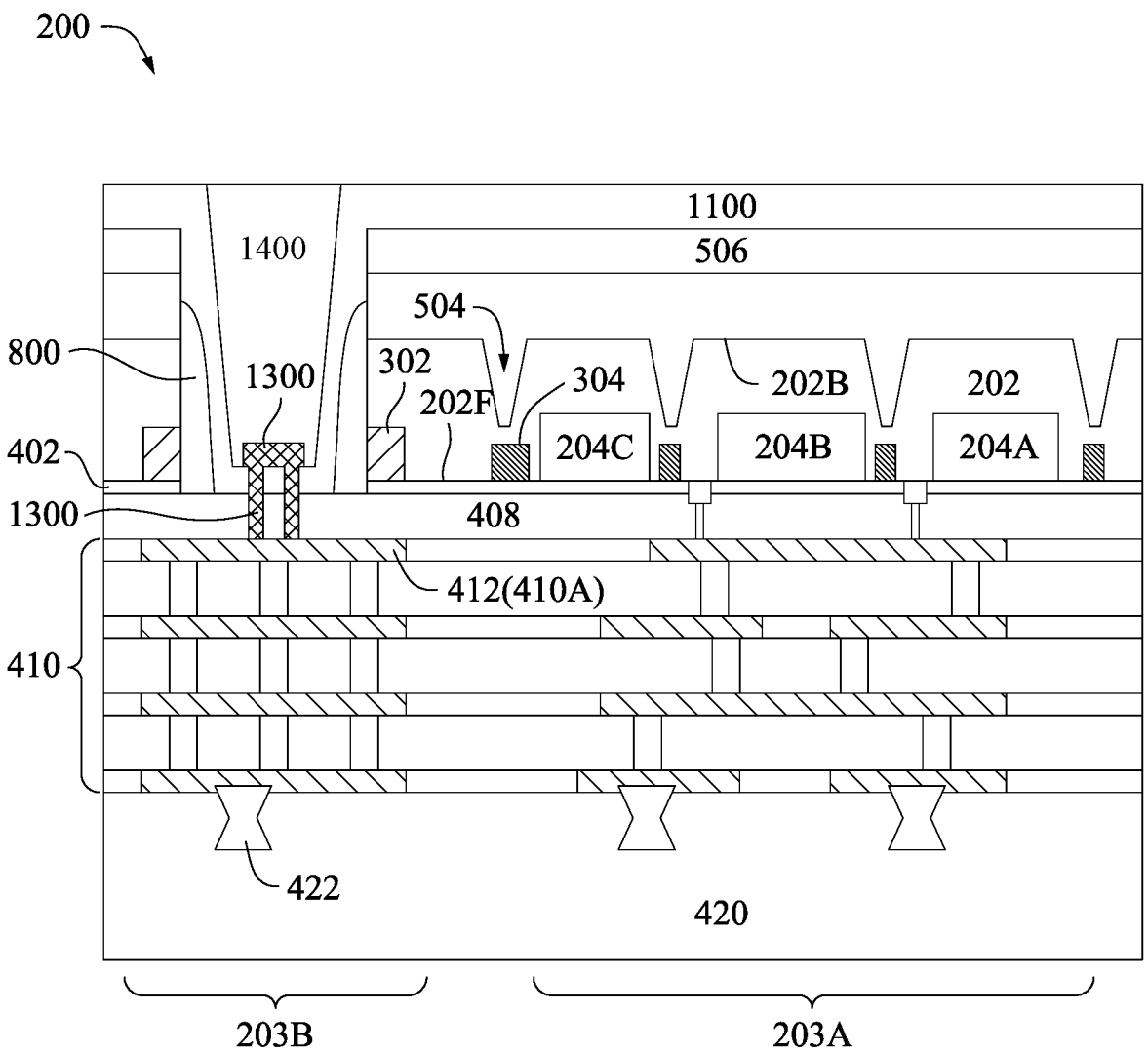

Corresponding to operation 122 of FIG. 1B, FIG. 14 is a cross-sectional view of the BSI image sensor device 200 including a dielectric layer 1400 at one of the various stages of fabrication. In some embodiments, the dielectric layer 1400 (e.g., a USG layer or another oxide) is deposited on the pad structure 1300. A top surface of the dielectric layer 1400 may be dished by a CMP process that polishes and removes deposited amounts of the dielectric layer 1400 on the second oxide layer 1100.

Figure 15:
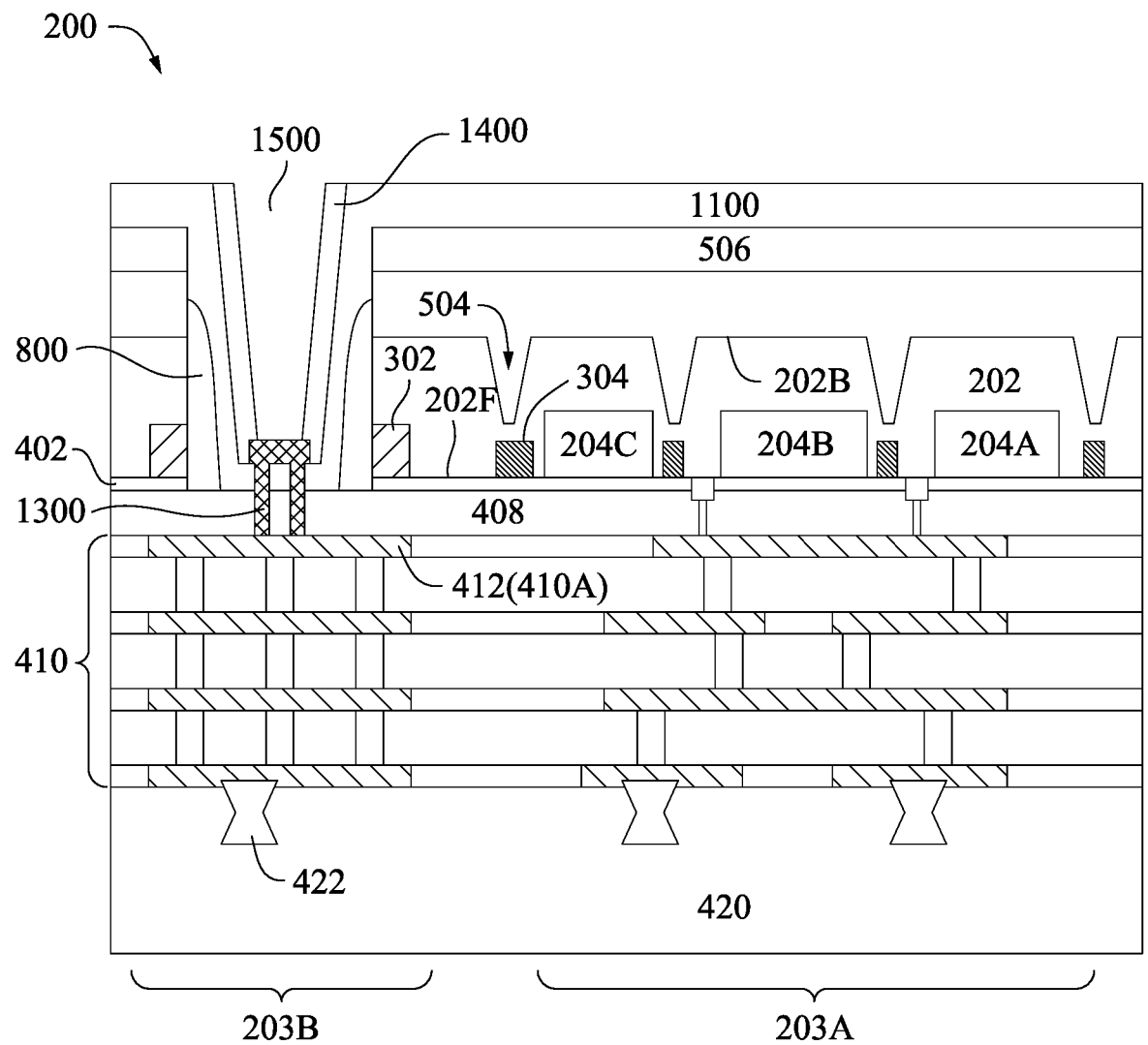

Corresponding to operation 124 of FIG. 1B, FIG. 15 is a cross-sectional view of the BSI image sensor device 200 including an opening 1500 extending through the dielectric layer 1400 at one of the various stages of fabrication. In some embodiments, the dielectric layer 1400 is patterned so that the opening 1500 is formed to expose a portion of the pad structure 1300. By way of example and not limitation, a wire connector, a solder ball, and/or a bond bump, not shown in FIG. 15, can be formed in the opening 1500. According to some embodiments, such a connector structure, through the pad structure 1300, electrically connects the line 412 of the metallization layers 410A to one or more external components.

Figure 16:
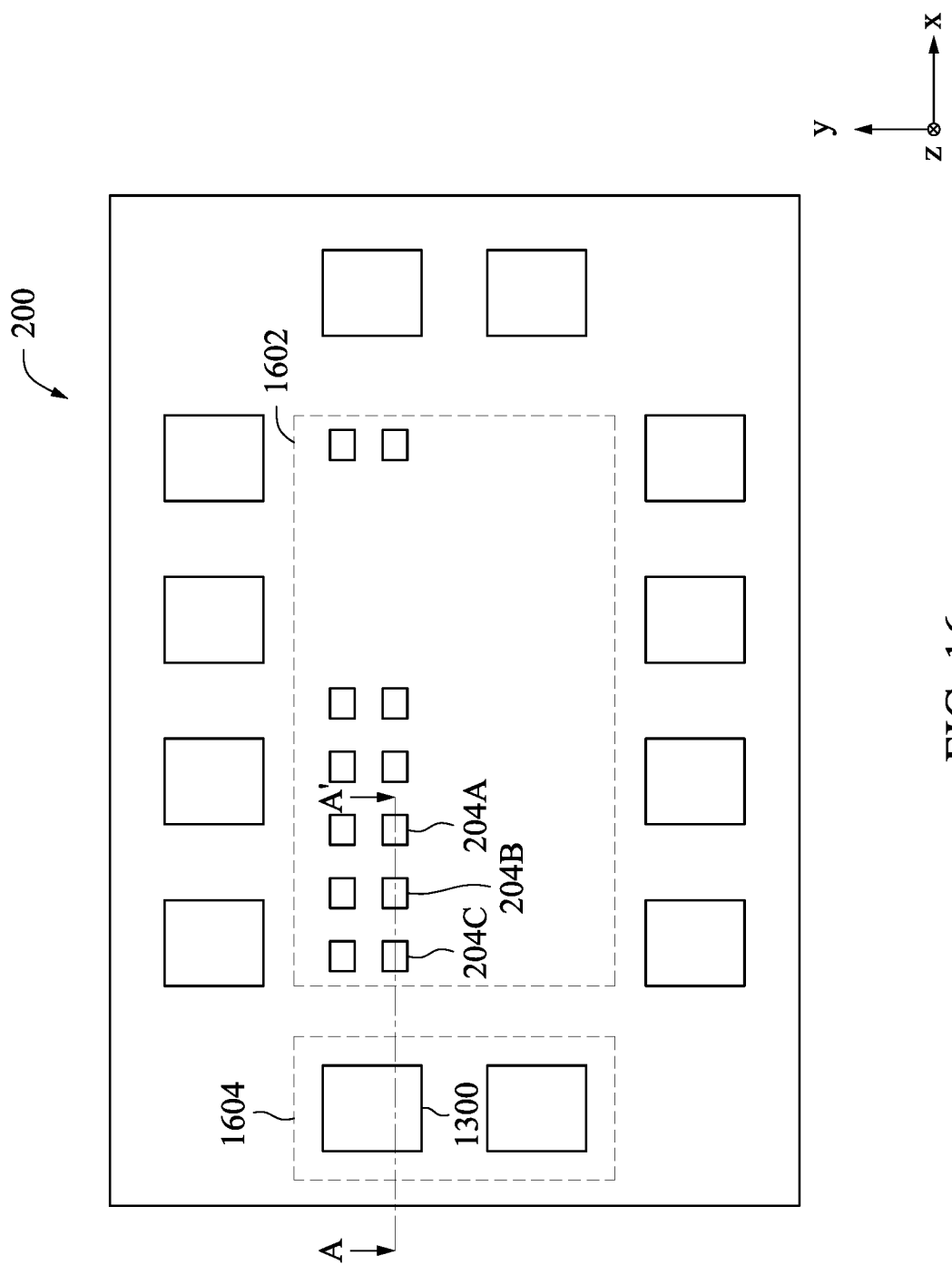
FIG. 16 illustrates a top view of the example image sensor device, illustrated in FIGS. 2-15, in accordance with some embodiments.

Referring to FIG. 16, a top view of the BSI image sensor device 200, viewed from the back surface 202B of the semiconductor substrate 202 is provided. FIGS. 2-15 correspond to the cross-sectional views of the BSI image sensor device 200, cut along line A-A'. As shown, the BSI image sensor device 200 may include other pixels and pad structures that are substantially similar as the pixels 204A-C and the pad structure 1300, respectively. According to various embodiments, such pixels can form a pixel array 1602 laterally surrounded by one or more pad arrays 1604 that each includes one or more of the pad structures 1300. In some embodiments, such pad arrays 1604 may be located around a perimeter of the semiconductor substrate 202.

In one aspect of the present disclosure, an image sensor device is disclosed. The image sensor device includes a semiconductor layer having a first surface and a second surface, where the second surface is opposite to the first surface. The image sensor device includes a conductive structure disposed over the first surface, with a dielectric layer disposed between the conductive structure and the first surface. The image sensor device includes a pad region including a recess extending through the semiconductor layer from the first surface to the second surface. The pad region further includes: a spacer layer extending along inner sidewalls of the recess; an oxide layer lining the recess over the spacer layer; and a pad structure extending through the oxide layer and the dielectric layer to be in physical contact with the conductive structure.

In another aspect of the present disclosure, an image sensor device is disclosed. The image sensor device includes a plurality of pixels disposed over a first surface of a semiconductor layer. The image sensor device includes a device layer disposed over the first surface. The image sensor device includes a plurality of metallization layers disposed over the device layer. One of the metallization layers that is closer to the first surface than any of other ones of the plurality of metallization layers includes at least one conductive structure. The image sensor device includes an oxide layer disposed over a second surface of the semiconductor layer, the second surface being opposite to the first surface, the oxide layer also lining a recess that extends through the semiconductor layer. The image sensor device includes a spacer layer disposed between inner sidewalls of the recess and the oxide layer. The image sensor device includes a pad structure extending through the oxide layer and the device layer such that the pad structure is in physical contact with the at least one conductive structure.

In yet another aspect of the present disclosure, a method includes forming, over a first surface of a semiconductor layer, a plurality of pixels configured to absorb radiation from a second surface of the semiconductor layer. The second surface of the semiconductor layer is opposite to the first surface of the semiconductor layer. The method includes forming a device layer over the first surface of the semiconductor layer. The method includes forming a metallization layer over the device layer. The method includes etching the second surface of the semiconductor layer to form a recess, the recess being laterally separated from the plurality of pixels. The method includes forming a spacer layer extending along inner sidewalls of the recess. The method includes forming an oxide layer over the second surface with the spacer layer sandwiched between the inner sidewalls and the oxide layer. The method includes etching the oxide layer and a portion of the device layer to expose a portion of the metallization layer. The method includes depositing a conductive material to form a pad structure electrically connected to the exposed portion of the metallization layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    forming, over a first surface of a semiconductor layer, a plurality of pixels configured to absorb radiation from a second surface of the semiconductor layer, the second surface of the semiconductor layer being opposite to the first surface of the semiconductor layer;
    forming a device layer over the first surface of the semiconductor layer;
    forming a metallization layer over the device layer;
    etching the second surface of the semiconductor layer to form a recess, the recess being laterally separated from the plurality of pixels;
    patterning a spacer layer to have a tapered profile extending along inner sidewalls of the recess;
    forming an oxide layer over the second surface with the spacer layer sandwiched between the inner sidewalls and the oxide layer;

etching the oxide layer and a portion of the device layer to expose a portion of the metallization layer; and depositing a conductive material to form a pad structure electrically connected to the exposed portion of the metallization layer.

2. The method of claim 1, wherein the spacer layer includes an upper portion having a first lateral width and a lower portion having a second lateral width, the second lateral width being greater than the first lateral width.

3. The method of claim 1, wherein the spacer layer includes a first oxide material and the oxide layer includes a second oxide material, the first oxide material having a greater etching resistivity than the second oxide material.

4. The method of claim 1, wherein the spacer layer and the oxide layer include the same polyethyloxazoline (PEOX), but the spacer layer has a greater etching resistivity than the oxide layer.

5. The method of claim 1, wherein the spacer layer and the oxide layer include the same material selected from a group consisting of: silicon oxide, undoped silicate glass (USG), phosphosilicate glass (PSG), borophosphosilicate glass (BPSG), fluorine-doped silicate glass (FSG), and combinations thereof, but the spacer layer has a greater etching resistivity than the oxide layer.

6. The method of claim 1, wherein the recess has a depth of at least about 2 μm.

7. The method of claim 1, wherein the plurality of pixels form an array laterally surrounded by the pad structure.

8. The method of claim 1, further comprising forming a dielectric layer between the device layer and the metallization layer.

9. The method of claim 8, wherein at least a portion of the oxide layer is in direct contact with the dielectric layer.

10. The method of claim 8, wherein the pad structure extends through the oxide layer and the dielectric layer to be in contact with the metallization layer.

11. A method, comprising:
forming, over a first surface of a semiconductor layer, a plurality of pixels;
forming a device layer over the first surface of the semiconductor layer;
forming a dielectric layer over the device layer;
forming a metallization layer over the dielectric layer;
etching a second surface of the semiconductor layer to form a recess, the recess being laterally separated from the plurality of pixels, the second surface being opposite to the first surface;
depositing a spacer layer over at least the recess;
patterning the spacer layer extending along portions of inner sidewalls of the recess, the patterned spacer layer has a tapered profile;
forming an oxide layer over the second surface with the patterned spacer layer sandwiched between the inner sidewalls and the oxide layer;
etching the oxide layer, a portion of the device layer, and a portion of the dielectric layer to expose a portion of the metallization layer; and
depositing a conductive material to form a pad structure electrically connected to the exposed portion of the metallization layer.

12. The method of claim 11, wherein the step of patterning the spacer layer comprises exposing the portion of the dielectric layer.

13. The method of claim 11, wherein the spacer layer includes an upper portion having a first lateral width and a lower portion having a second lateral width, the second lateral width being greater than the first lateral width.

14. The method of claim 11, wherein the spacer layer includes a first oxide material and the oxide layer includes a second oxide material, the first oxide material having a greater etching resistivity than the second oxide material.

15. The method of claim 11, wherein the spacer layer and the oxide layer include the same polyethyloxazoline (PEOX), but the spacer layer has a greater etching resistivity than the oxide layer.

16. The method of claim 11, wherein the spacer layer and the oxide layer include the same material selected from a group consisting of: silicon oxide, undoped silicate glass (USG), phosphosilicate glass (PSG), borophosphosilicate glass (BPSG), fluorine-doped silicate glass (FSG), and combinations thereof, but the spacer layer has a greater etching resistivity than the oxide layer.

17. The method of claim 11, wherein the recess has a depth of at least about 2 μm.

18. A method, comprising:
forming, over a first surface of a semiconductor layer, a plurality of pixels configured to absorb radiation from a second surface of the semiconductor layer, the second surface of the semiconductor layer being opposite to the first surface of the semiconductor layer;
forming a device layer over the first surface of the semiconductor layer;
forming a dielectric layer over the device layer;
forming a metallization layer over the dielectric layer;
etching the second surface of the semiconductor layer to form a recess, the recess being laterally separated from the plurality of pixels;
depositing a spacer layer over at least the recess;
patterning the spacer layer extending along portions of inner sidewalls of the recess, the patterned spacer layer has a tapered profile;
forming an oxide layer over the second surface with the patterned spacer layer sandwiched between the inner sidewalls and the oxide layer;
etching the oxide layer, a portion of the device layer, and a portion of the dielectric layer to expose a portion of the metallization layer; and
depositing a conductive material to form a pad structure electrically connected to the exposed portion of the metallization layer.

19. The method of claim 18, wherein the spacer layer and the oxide layer include the same polyethyloxazoline (PEOX), but the spacer layer has a greater etching resistivity than the oxide layer.

20. The method of claim 18, wherein the spacer layer and the oxide layer include the same material selected from a group consisting of: silicon oxide, undoped silicate glass (USG), phosphosilicate glass (PSG), borophosphosilicate glass (BPSG), fluorine-doped silicate glass (FSG), and combinations thereof, but the spacer layer has a greater etching resistivity than the oxide layer.

* * * * *